US009007250B1

(12) United States Patent
Jeraj et al.

(10) Patent No.: US 9,007,250 B1
(45) Date of Patent: Apr. 14, 2015

(54) TIME-INTERLEAVED AND SUB-BAND RECONSTRUCTION APPROACHES TO DIGITAL-TO-ANALOG CONVERSION FOR HIGH SAMPLE RATE WAVEFORM GENERATION

(71) Applicant: L-3 Communications Corp., New York, NY (US)

(72) Inventors: Janez Jeraj, Farmington, UT (US); Osama S. Haddadin, Salt Lake City, UT (US); Francis J. Smith, Park City, UT (US)

(73) Assignee: L-3 Communications Corp., New York, NY (US)

( * ) Notice: Subject to any disclaimer, the term of this patent is extended or adjusted under 35 U.S.C. 154(b) by 0 days.

(21) Appl. No.: 14/059,932

(22) Filed: Oct. 22, 2013

(51) Int. Cl.
*H03M 1/66* (2006.01)
(52) U.S. Cl.
CPC ....................................... *H03M 1/66* (2013.01)
(58) Field of Classification Search
CPC ....... H03M 1/66; H03M 3/464; H03M 1/662; H03M 1/661; H03M 1/1061; H03M 1/0607; H03M 1/1057; H03M 3/372
USPC .................................................. 341/144–154
See application file for complete search history.

(56) References Cited

U.S. PATENT DOCUMENTS

| 6,483,450 | B2 * | 11/2002 | Boehm et al. | 341/144 |
| 6,587,514 | B1 * | 7/2003 | Wright et al. | 375/296 |
| 6,603,418 | B2 * | 8/2003 | Al-Awadhi | 341/144 |
| 6,697,436 | B1 * | 2/2004 | Wright et al. | 375/296 |
| 6,925,130 | B2 * | 8/2005 | Chan | 375/295 |
| 7,084,710 | B2 * | 8/2006 | Huang et al. | 331/16 |
| 7,317,413 | B2 * | 1/2008 | Lee | 341/144 |
| 7,501,969 | B2 * | 3/2009 | Schoner | 341/144 |
| 2001/0054974 | A1 * | 12/2001 | Wright | 341/144 |
| 2005/0052301 | A1 * | 3/2005 | Mills | 341/144 |
| 2005/0157814 | A1 * | 7/2005 | Cova et al. | 375/297 |
| 2005/0258992 | A1 * | 11/2005 | Fontaine et al. | 341/144 |
| 2009/0052556 | A1 * | 2/2009 | Fernandez | 375/241 |
| 2012/0176190 | A1 * | 7/2012 | Goodman et al. | 327/551 |
| 2012/0188461 | A1 * | 7/2012 | Katsis et al. | 348/720 |
| 2012/0201330 | A1 * | 8/2012 | McHenry | 375/297 |

* cited by examiner

*Primary Examiner* — Linh Nguyen
(74) *Attorney, Agent, or Firm* — Kirton McConkie

(57) ABSTRACT

The perceived sample rate at which a DAC can operate can be increased by allowing multiple DACs to process different portions of a digital signal in parallel. In this way, the outputs of multiple DACs can be combined into a single analog signal to achieve the desired speeds and resolutions of the analog output. This parallel processing can be implemented using a time-interleaving technique or a sub-band reconstruction technique. Pre-distortion can be applied to the digital input signal to compensate for degradation detected in the analog output signal. By applying pre-distortion, waveforms having high sampling rates can be efficiently generated.

33 Claims, 17 Drawing Sheets

| DAC Clock | Desired Output | Inputs to DACs | | | Outputs From Delays | | | Actual Output |
|---|---|---|---|---|---|---|---|---|
| | | DAC1 (p=0) | DAC2 (p=1) | DAC3 (p=2) | Delay1 | Delay2 | Delay3 | |
| $X_0$ | $R_0$ 3 | 1 | 1 | 1 | 1 | ? | ? | $R_{-2}$ ? |
| | $R_1$ 7 | 1 | 1 | 1 | 1 | 1 | ? | $R_{-1}$ ? |
| | $R_2$ 1 | 1 | 1 | 1 | 1 | 1 | 1 | $R_0$ 3 |
| $X_1$ | $R_3$ -3 | 5 | -5 | -3 | 5 | -5 | 1 | $R_1$ 7 |
| | $R_4$ -8 | 5 | -5 | -3 | 5 | -5 | 1 | $R_2$ 1 |
| | $R_5$ -2 | 5 | -5 | -3 | 5 | -5 | -3 | $R_3$ -3 |
| $X_2$ | $R_6$ 3 | 0 | 1 | 2 | 0 | 1 | -3 | $R_4$ -8 |
| | $R_7$ 5 | 0 | 1 | 2 | 0 | 1 | -3 | $R_5$ -2 |
| | $R_8$ 6 | 0 | 1 | 2 | 0 | 1 | 2 | $R_6$ 3 |
| $X_3$ | $R_9$ 7 | 2 | 2 | 3 | 2 | 2 | 2 | $R_7$ 5 |
| | $R_{10}$ -8 | 2 | 2 | 3 | 2 | 2 | 2 | $R_8$ 6 |
| | $R_{11}$ -7 | 2 | 2 | 3 | 2 | 2 | 3 | $R_9$ 7 |
| $X_4$ | $R_{12}$ -6 | -13 | 3 | 4 | -13 | 2 | 3 | $R_{10}$ -8 |
| | $R_{13}$ -5 | -13 | 3 | 4 | -13 | 3 | 3 | $R_{11}$ -7 |
| | $R_{14}$ -4 | -13 | 3 | 4 | -13 | 3 | 4 | $R_{12}$ -6 |
| $X_5$ | $R_{15}$ -3 | -12 | 4 | 5 | -12 | 3 | 4 | $R_{13}$ -5 |
| | $R_{16}$ -2 | -12 | 4 | 5 | -12 | 4 | 4 | $R_{14}$ -4 |
| | $R_{17}$ -1 | -12 | 4 | 5 | -12 | 4 | 5 | $R_{15}$ -3 |
| $X_6$ | $R_{18}$ 0 | -11 | 5 | 6 | -11 | 4 | 5 | $R_{16}$ -2 |
| | $R_{19}$ 1 | -11 | 5 | 6 | -11 | 5 | 5 | $R_{17}$ -1 |
| | $R_{20}$ 2 | -11 | 5 | 6 | -11 | 5 | 6 | $R_{18}$ 0 |
| $X_7$ | $R_{21}$ 3 | -10 | 6 | 7 | -10 | 5 | 6 | $R_{19}$ 1 |
| | $R_{22}$ 4 | -10 | 6 | 7 | -10 | 6 | 6 | $R_{20}$ 2 |
| | $R_{23}$ 5 | -10 | 6 | 7 | -10 | 6 | 7 | $R_{21}$ 3 |

FIG. 6

| DAC Clock | Desired Output | Inputs to DACs | | | Outputs From Delays | | | Actual Output |
|---|---|---|---|---|---|---|---|---|
| | | DAC1 (p = 0) | DAC2 (p = 1) | DAC3 (p = 2) | Delay1 | Delay2 | Delay3 | |
| $X_0$ | $R_0$ = 3 | 1 | 1 | 1 | 1 | ? | ? | $R_{-2}$ = ? |
| | $R_1$ = 7 | 1 | 1 | 1 | 1 | 1 | ? | $R_{-1}$ = ? |
| | $R_2$ = 1 | 5 | 5 | 3 | 5 | 1 | 1 | $R_0$ = 3 |
| $X_1$ | $R_3$ = -3 | 5 | -5 | -3 | 5 | 1 | 1 | $R_1$ = 7 |
| | $R_4$ = -8 | 5 | -5 | -3 | 5 | -5 | 1 | $R_2$ = 1 |
| | $R_5$ = -2 | 0 | 1 | 2 | 0 | -5 | -3 | $R_3$ = -3 |
| $X_2$ | $R_6$ = 3 | 0 | 1 | 2 | 0 | -5 | -3 | $R_4$ = -8 |
| | $R_7$ = 5 | 0 | 1 | 2 | 0 | 1 | -3 | $R_5$ = -2 |
| | $R_8$ = 6 | 2 | 2 | 3 | 2 | 1 | 2 | $R_6$ = 3 |
| $X_3$ | $R_9$ = 7 | 2 | 2 | 3 | 2 | 1 | 2 | $R_7$ = 5 |
| | $R_{10}$ = -8 | 2 | 2 | 3 | 2 | 2 | 2 | $R_8$ = 6 |
| | $R_{11}$ = -7 | -13 | -13 | 4 | -13 | 2 | 3 | $R_9$ = 7 |
| $X_4$ | $R_{12}$ = -6 | -13 | -13 | 4 | -13 | 2 | 3 | $R_{10}$ = -8 |
| | $R_{13}$ = -5 | -13 | -13 | 4 | -13 | -13 | 3 | $R_{11}$ = -7 |
| | $R_{14}$ = -4 | -12 | -12 | 5 | -12 | -13 | 4 | $R_{12}$ = -6 |
| $X_5$ | $R_{15}$ = -3 | -12 | -12 | 5 | -12 | -13 | 4 | $R_{13}$ = -5 |
| | $R_{16}$ = -2 | -12 | -12 | 5 | -12 | -12 | 4 | $R_{14}$ = -4 |
| | $R_{17}$ = -1 | -11 | -11 | 6 | -11 | -12 | 5 | $R_{15}$ = -3 |
| $X_6$ | $R_{18}$ = 0 | -11 | -11 | 6 | -11 | -12 | 5 | $R_{16}$ = -2 |
| | $R_{19}$ = 1 | -11 | -11 | 6 | -11 | -11 | 5 | $R_{17}$ = -1 |
| | $R_{20}$ = 2 | -10 | -10 | 7 | -10 | -11 | 6 | $R_{18}$ = 0 |
| $X_7$ | $R_{21}$ = 3 | -10 | -10 | 7 | -10 | -11 | 6 | $R_{19}$ = 1 |
| | $R_{22}$ = 4 | -10 | -10 | 7 | -10 | -10 | 6 | $R_{20}$ = 2 |
| | $R_{23}$ = 5 | | | | | | 7 | $R_{21}$ = 3 |

| DAC Clock | Desired Output | Inputs to DACs ||| Outputs From Delays ||| Actual Output |
|---|---|---|---|---|---|---|---|---|
| | | DAC1 (p = 0) | DAC2 (p = 1) | DAC3 (p = 2) | Delay1 | Delay2 | Delay3 | |
| $X_0$ | $R_0$ 3 | 1 | 1 | 1 | 1 | ? | ? | $R_{-2}$ ? |
| | $R_1$ 7 | 1 | 1 | 1 | 1 | 1 | ? | $R_{-1}$ ? |
| | $R_2$ 1 | 1 | -5 | 1 | 1 | 1 | 1 | $R_0$ 3 |
| $X_1$ | $R_3$ -3 | 5 | -5 | -3 | 5 | 1 | 1 | $R_1$ 7 |
| | $R_4$ -8 | 5 | -5 | -3 | 5 | -5 | 1 | $R_2$ 1 |
| | $R_5$ -2 | 5 | 1 | -3 | 5 | -5 | -3 | $R_3$ -3 |
| $X_2$ | $R_6$ 3 | 0 | 1 | 2 | 0 | -5 | -3 | $R_4$ -8 |
| | $R_7$ 5 | 0 | 1 | 2 | 0 | 1 | -3 | $R_5$ -2 |
| | $R_8$ 6 | 0 | 1 | 2 | 0 | 1 | 2 | $R_6$ 3 |
| $X_3$ | $R_9$ 7 | 2 | 2 | 3 | 2 | 1 | 2 | $R_7$ 5 |
| | $R_{10}$ -8 | 2 | 2 | 3 | 2 | 2 | 2 | $R_8$ 6 |
| | $R_{11}$ -7 | 2 | 2 | 3 | 2 | 2 | 3 | $R_9$ 7 |
| $X_4$ | $R_{12}$ -6 | -13 | 3 | 4 | -13 | 2 | 3 | $R_{10}$ -8 |
| | $R_{13}$ -5 | -13 | 3 | 4 | -13 | 3 | 3 | $R_{11}$ -7 |
| | $R_{14}$ -4 | -13 | 3 | 4 | -13 | 3 | 4 | $R_{12}$ -6 |
| $X_5$ | $R_{15}$ -3 | -12 | 4 | 5 | -12 | 3 | 4 | $R_{13}$ -5 |
| | $R_{16}$ -2 | -12 | 4 | 5 | -12 | 4 | 4 | $R_{14}$ -4 |
| | $R_{17}$ -1 | -12 | 4 | 5 | -12 | 4 | 5 | $R_{15}$ -3 |
| $X_6$ | $R_{18}$ 0 | -11 | 5 | 6 | -11 | 4 | 5 | $R_{16}$ -2 |
| | $R_{19}$ 1 | -11 | 5 | 6 | -11 | 5 | 5 | $R_{17}$ -1 |
| | $R_{20}$ 2 | -11 | 5 | 6 | -11 | 5 | 6 | $R_{18}$ 0 |
| $X_7$ | $R_{21}$ 3 | -10 | 6 | 7 | -10 | 5 | 6 | $R_{19}$ 1 |
| | $R_{22}$ 4 | -10 | 6 | 7 | -10 | 6 | 6 | $R_{20}$ 2 |
| | $R_{23}$ 5 | -10 | 6 | 7 | -10 | 6 | 7 | $R_{21}$ 3 |

TIME-INTERLEAVED AND SUB-BAND RECONSTRUCTION APPROACHES TO DIGITAL-TO-ANALOG CONVERSION FOR HIGH SAMPLE RATE WAVEFORM GENERATION

BACKGROUND

A digital-to-analog converter ("DAC") is used to convert a digital signal into an analog signal and is commonly used in radio frequency (RF) systems to convert a digital signal into an analog signal that can be mixed with a carrier frequency for transmission over a medium. A DAC samples a digital signal at a specified rate and converts the sampled values of the digital signal into corresponding analog values.

The precision of a DAC is based on the number of bits per sample and the sampling rate among other factors. For example, the number of bits per sample defines how many different values can be output by the DAC. In a simple case where a DAC can detect only two values (i.e. a 1-bit DAC), the generated analog waveform would vary between a high and low value (e.g. 0 and 5 volts). In contrast, a DAC capable of sampling 12 bits at a time (i.e. a 12-bit DAC) would be capable of outputting 4096 ($2^{12}$) different analog values. Because of the higher number of possible outputs, a higher-bit DAC can more precisely output a desired value.

Similarly, a DAC with a higher sampling rate is more precise than a DAC with a lower sampling rate. The time period between each sampling represents a time when the actual analog value is assumed. Specifically, the value of the analog signal between two samplings is defined not by a specified digital value but by the value of the analog output as it changes from one sampled value to the next. This assumption can be represented visibly as the smoothing of a curve between two points representing defined values of the analog output.

FIG. 1 illustrates an example of how a 4-bit DAC 100 converts a digital signal into an analog signal, V(t). As a 4-bit DAC, DAC 100 samples an input digital signal four bits at a time and can output 16 discrete values as identified by the lines on the y-axis of the graph. The sampling rate at which DAC 100 operates defines how frequently the digital signal is sampled.

Generally, there is a tradeoff between the resolution and the sampling rate of a DAC. For example, a DAC designed to operate at higher resolution (i.e. a DAC that samples a greater number of bits at a time) generally requires a lower frequency of sampling. Common examples of DACs include a 12-bit DAC that samples at a maximum frequency of 4 GHz and a 16-bit DAC that samples at a maximum frequency of 1 GHz. A 16-bit DAC at a sampling frequency of 4 GHz is not achievable in the current state-of-the-art.

Unfortunately, in many systems, it is desirable to perform digital-to-analog conversion at rates exceeding those obtainable using current DAC technology. For example, in high capacity systems, wideband waveform generators, electronic attack, and other systems, it may not be possible to obtain the high resolution and high-speed conversions necessary to implement a satisfactory system.

FIG. 2 illustrates how a DAC can be incapable of outputting an analog signal with a desired accuracy. The graph on the left side is the same as in FIG. 1 and represents the actual output of DAC 100. The graph on the right, however, represents a desired output for the system. As shown by the dashed line between points 103 and 104, the relatively smooth line (which would become smooth after the signal is passed through a low pass filter) is unobtainable between points 103 and 104 because DAC 100 cannot sample quickly enough to output the desired waveform. A similar result will occur if the DAC has insufficient resolution to output each desired value.

SUMMARY

The present invention is generally directed to methods and systems which increase the perceived sampling rate at which a DAC can operate by allowing multiple DACs to process different portions of a digital signal in parallel. In this way, the outputs of multiple DACs can be combined into a single analog signal to achieve the desired speeds and resolutions of the analog output.

This parallel processing can be implemented using one of two techniques: a time-interleaving technique or a sub-band reconstruction technique. In the time-interleaving technique, the sampling time of each DAC is interleaved so that each DAC can sample the input signal at a different time. The total sampling rate is therefore increased by a multiple of the number of DACs used. The outputs of each DAC are summed together after an appropriate time shift has been applied to form the output waveform.

In the sub-band reconstruction technique, a plurality of DACs each process a separate sub-band of a digital signal in parallel. The outputs of each DAC are then summed together after an appropriate frequency shift has been applied to form the output waveform. Using these techniques, the perceived sample rate of the DAC component will be a function of the number of DACs operating in parallel.

To account for degradation in the analog output signal that occurs when using parallel arrangements of DACs, the present invention can employ pre-distortion techniques. The pre-distortion techniques can detect degradation present in the output signal and apply appropriate pre-distortion to compensate for the detected degradation. The pre-distortion can be dynamically adjusted to adapt to the changing performance of the system.

In some embodiments, the present invention is implemented as a system for producing a wideband signal using a parallel arrangement of DACs that each generate a different sub-band of the wideband signal. The system includes a waveform generator for generating a digital signal to be converted into an analog wideband signal; a frequency decomposer that receives the digital signal and divides the digital signal into M sub-bands; a parallel arrangement of M DACs, each of the M DACs for receiving one of the M sub-bands of the digital signal, and for generating an analog value representing the corresponding sub-band of the digital signal; for each of at least some of the M DACs, a frequency shifter for shifting the frequency of the analog value representing the corresponding sub-band of the digital signal; and an adder for summing each of the analog values generated by the M DACs into an analog output signal.

In other embodiments, the present invention can be implemented as a system for producing a wideband signal using a parallel arrangement of DACs. The system comprises a waveform generator for generating a digital signal to be converted into an analog wideband signal; an arithmetic decomposition module that receives the digital signal and calculates samples to be provided to the DACs based on the value of the digital signal; the parallel arrangement of DACs that each convert samples received from the arithmetic decomposition module into analog values; means for providing a delay to the analog values output by at least some of the DACs; and a combining module for combining the analog values generated by the DACs into an analog output signal. The arithmetic decomposition module calculates samples for a particular DAC using the following formula:

$$S_{p,t} = R_t - R_{t-1} + S_{p,t-1}$$

where $S_{p,t}$ is the next sample to be input to the particular DAC, $S_{p,t-1}$ is the previous sample that was input to the particular DAC, and $R_t$ is the current desired value of the analog output signal. P represents the position of the parallel DAC in the parallel arrangement of DACs.

In other embodiments, the present invention can be implemented as system for applying pre-distortion to an input waveform supplied to a parallel arrangement of DACs. The system comprises a waveform generator for generating a digital input signal; a parallel arrangement of DACs, the parallel arrangement receiving the digital input signal and outputting an analog signal comprising the sum of each DAC; and a pre-distortion processor for applying pre-distortion to the digital input signal to compensate for degradations that will occur to the digital signal as the digital signal is processed by the parallel arrangement of DACs.

In other embodiments, the present invention can be implemented as a method for applying pre-distortion to a digital input signal to compensate for degradation caused when multiple DACs are used in parallel to generate an analog output signal. An analog output signal is received. The analog output signal is generated from a digital input signal by multiple DACs that are arranged in parallel. The analog output signal is generated by summing the outputs of each of the DACs. A value of the analog output signal is compared to a corresponding value of the digital input signal from which the value of the analog output signal was generated. Based on the comparison, a degradation that is present in the analog output signal is detected. Pre-distortion is then applied to the digital input signal before the digital input signal is processed by the multiple DACs, the pre-distortion compensating for the degradation present in the analog output signal.

BRIEF DESCRIPTION OF THE DRAWINGS

FIGS. 6, 6A, and 6B illustrate an example of how an arithmetic decomposition module can calculate samples for each DAC in a system that employs three DACs in parallel;

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention is generally directed to methods and systems which increase the sample rate at which a DAC can operate by allowing multiple DACs to process different portions of a digital signal in parallel. In this way, the outputs of multiple DACs can be combined into a single analog signal to achieve the desired speeds and resolutions of the analog output.

This parallel processing can be implemented using one of two techniques: a time interleaving technique or a sub-band reconstruction technique. In the time interleaving technique, the sampling time of each DAC is interleaved so that each DAC can sample the input signal at a different time. The total sampling rate is therefore increased by a multiple of the number of DACs used. The outputs of each DAC are summed together after an appropriate time shift has been applied to form the output waveform.

In the sub-band reconstruction technique, a plurality of DACs each process a separate sub-band of a digital signal in parallel. The outputs of each DAC are then summed together after an appropriate shift has been applied to form the output waveform. Using these techniques, the perceived speed of the DAC component will be a function of the number of DACs operating in parallel.

Figure 1:
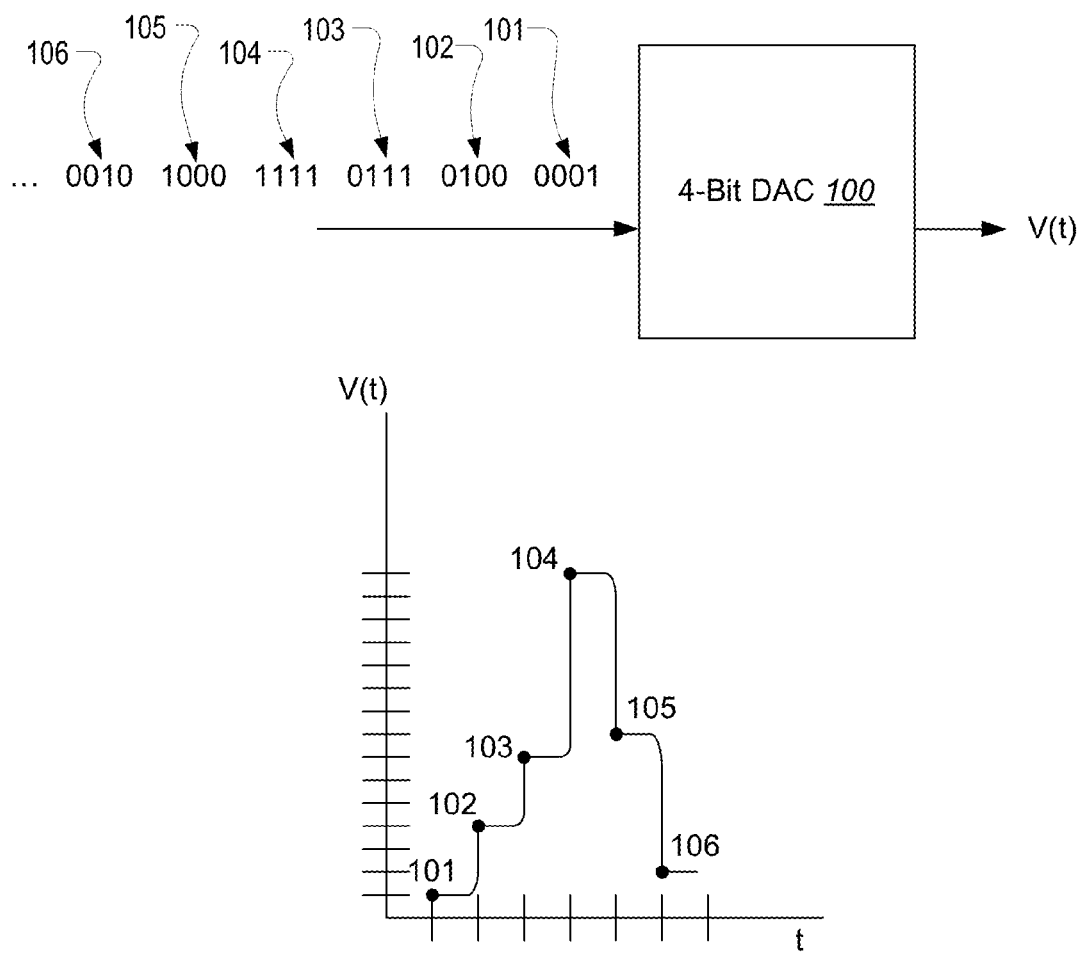
FIG. 1 illustrates an example of how a 4-bit DAC converts a digital signal into an analog signal.
Figure 2:
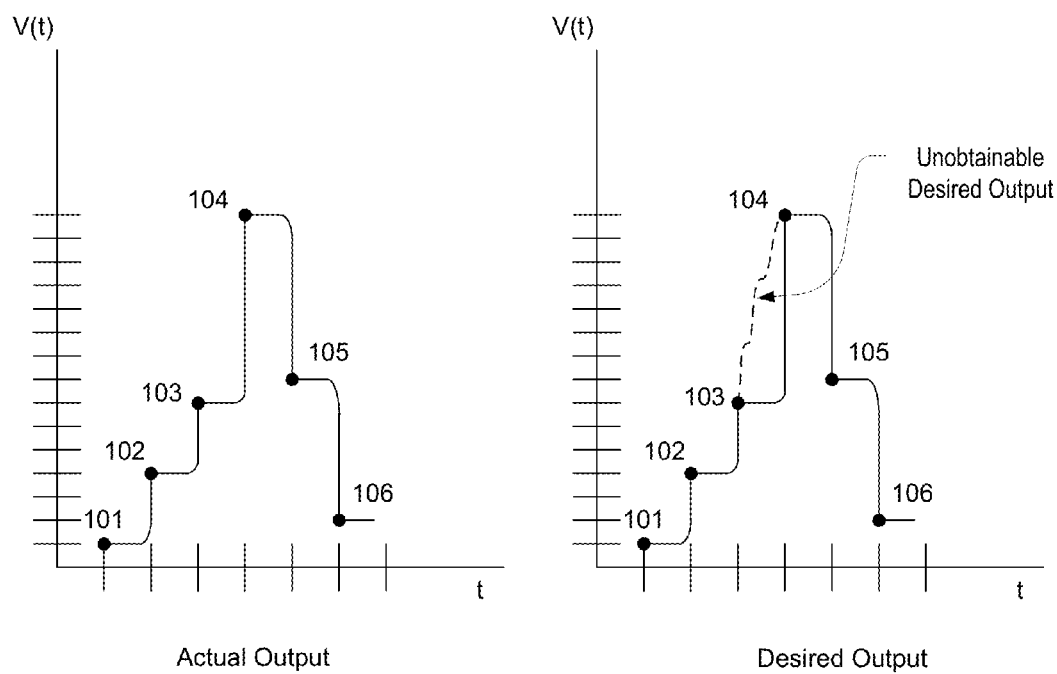
FIG. 2 illustrates how a DAC can be incapable of outputting a desired analog signal.
Figure 3:
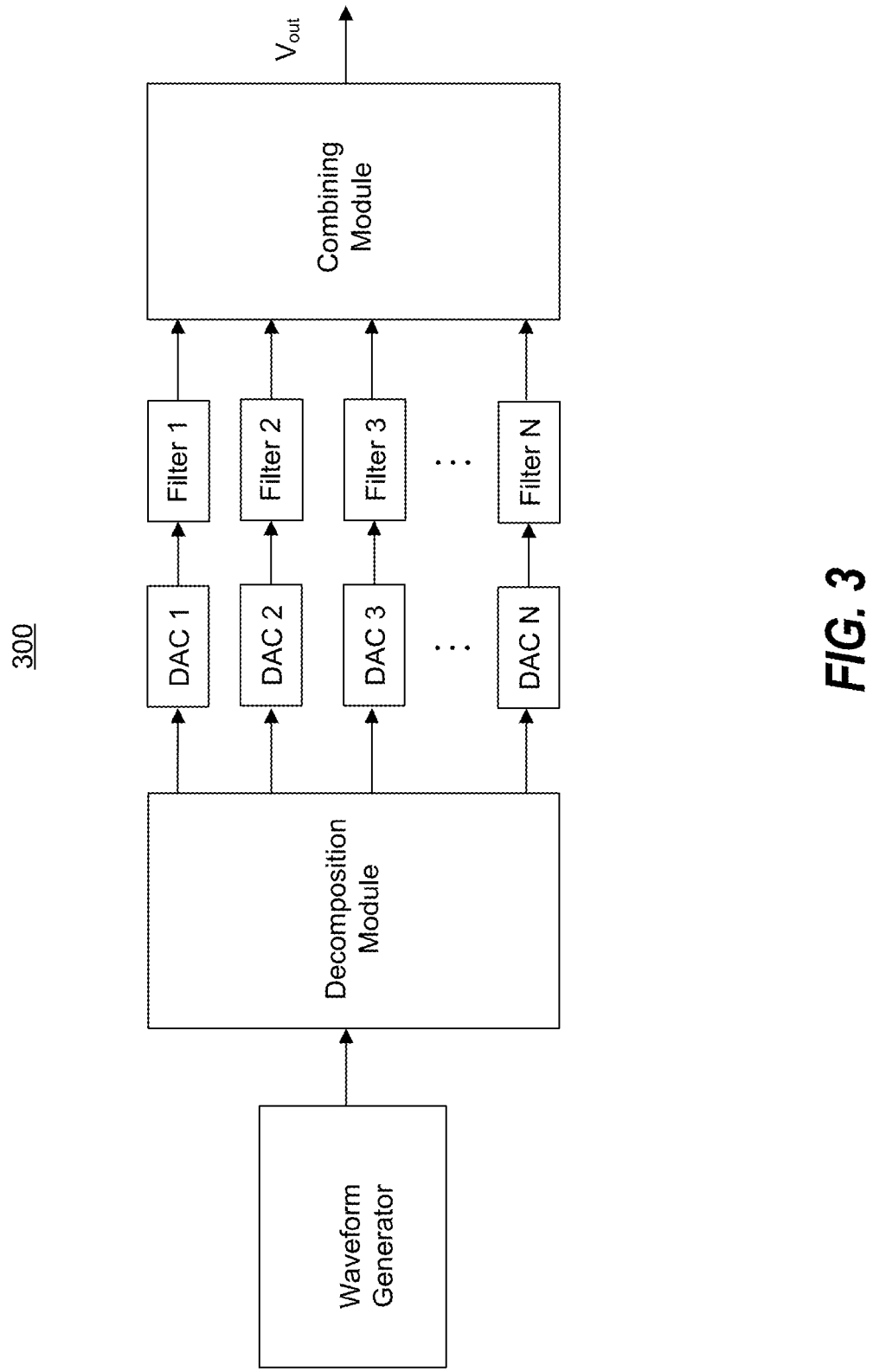
FIG. 3 illustrates a block diagram that can generally represent a system that employs multiple DACs in parallel.

FIG. 3 illustrates a block diagram that can generally represent a system 300 that employs multiple DACs in parallel (e.g. a system employing time-interleaving techniques or a system employing sub-band reconstruction techniques). System 300 includes a waveform generator that generates a digital waveform. The digital waveform is input to a decomposition module which divides the digital waveform into a number of subcomponents corresponding to the number of DACs used in the system (e.g. time-interleaved samples or sub-bands). The subcomponents of the digital waveform are then input to the corresponding DAC which converts the digital subcomponent into an analog value. The analog values are then filtered and combined by combining module to form the analog output signal.

Time-Interleaved DACs

Figure 4A:
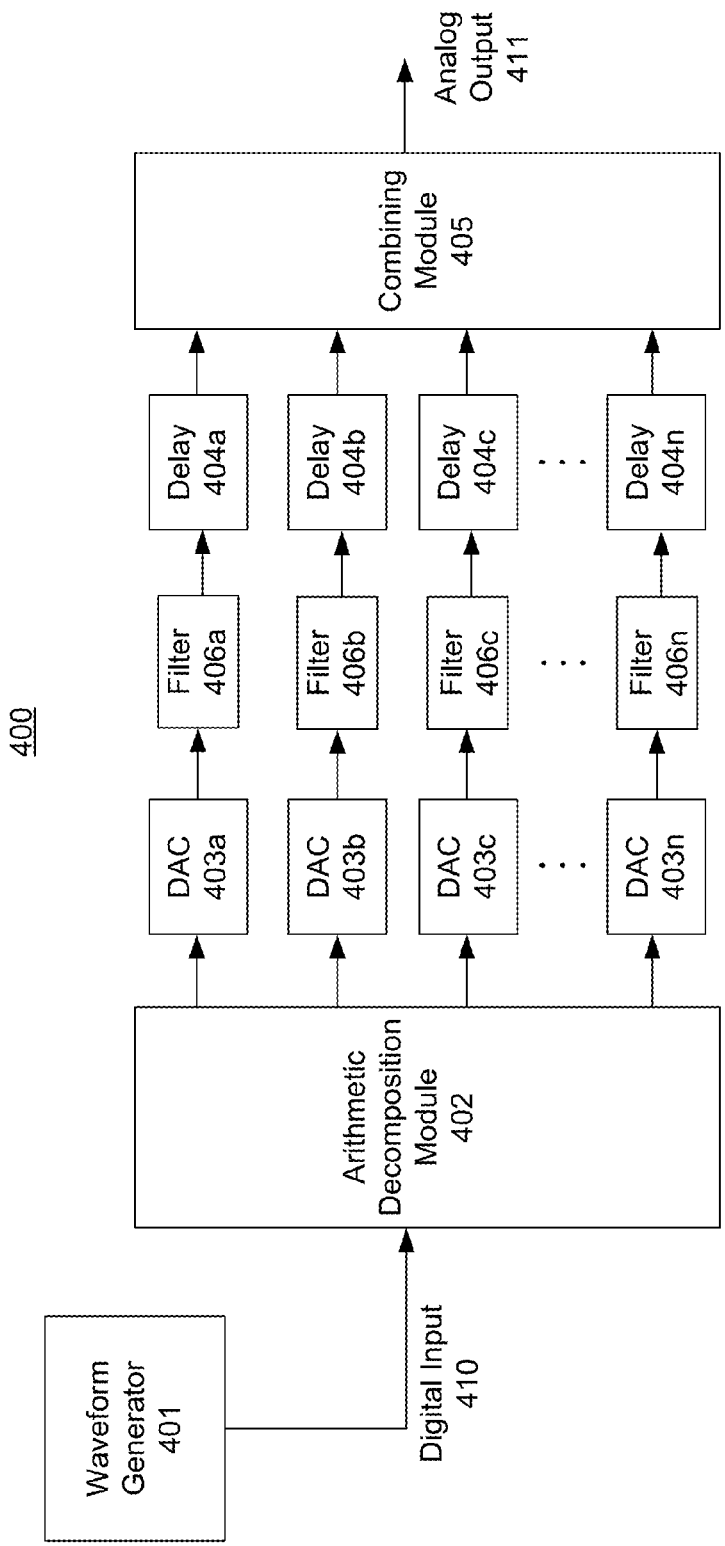
FIGS. 4A and 4B each illustrate an example system that can employ time-interleaving techniques using multiple DACs in parallel.

FIG. 4A illustrates an example system 400 that can employ time-interleaving techniques using multiple DACs in parallel. System 400 includes similar components as system 300 with the addition of delays 404a-404n. Also, system 400 includes an arithmetic decomposition module 402 which divides a digital input 410 defining the desired analog waveform into a plurality of samples.

Delays 404a-404n apply different delays to each path which results in the summed output of the DACs being changed (or capable of being changed) at a higher frequency than if a single DAC were used. For example, when three DACs are used, the value of analog output 411 will be updated three times more frequently than if a single DAC were used.

Figure 5:
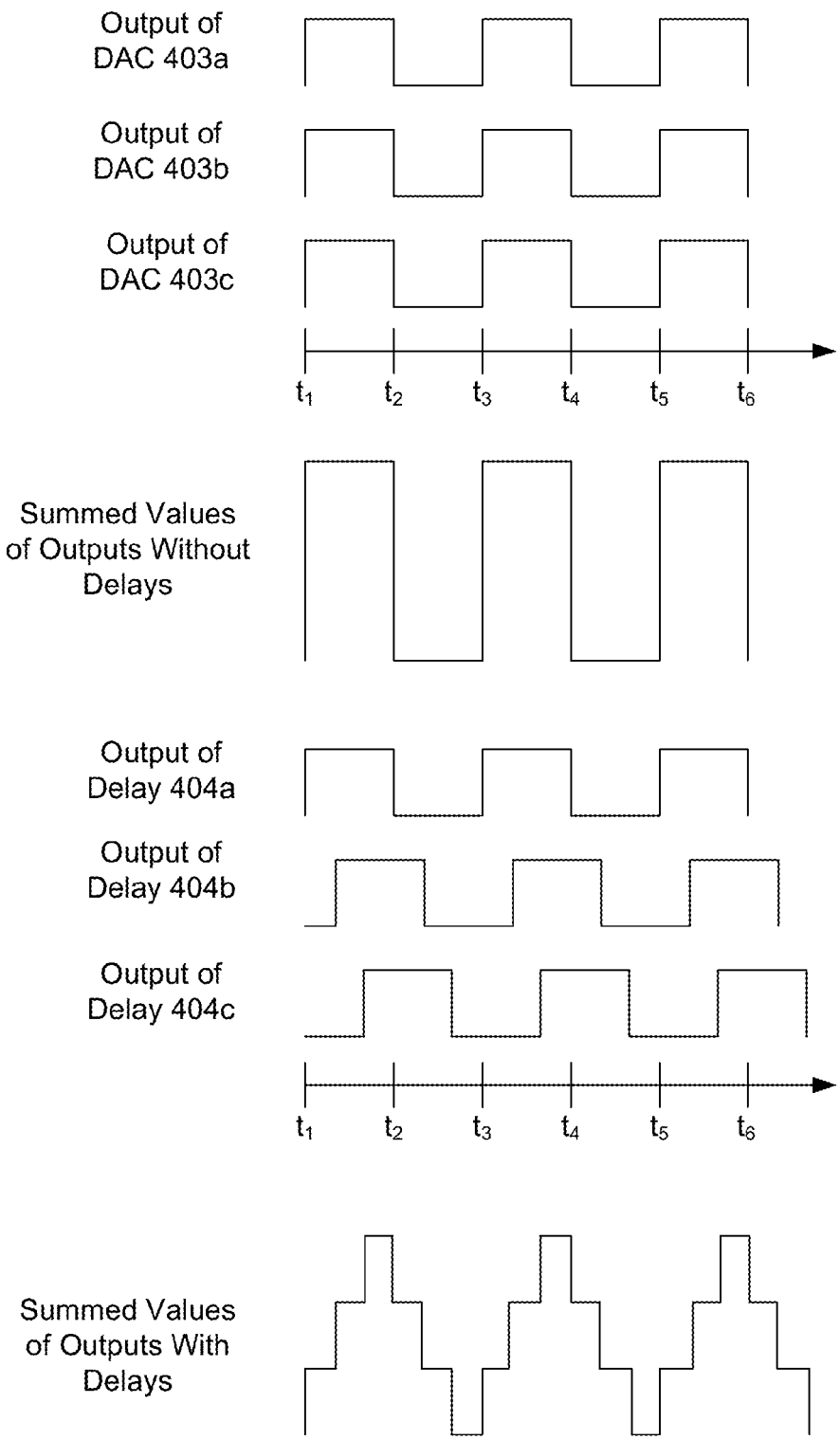
FIG. 5 illustrates how the time-interleaving technique employs delays and a combining module to allow an analog output to be updated more frequently.

FIG. 5 illustrates how delays 404a-404n and combining module 405 allow analog output 411 to be updated more frequently. The top portion of FIG. 5 illustrates the outputs of DACs 403a-403c prior to passing through delays 404a-404c. If these outputs were summed at this time, prior to passing through delays, the summed output would change value only as frequently as the DACs change outputs (e.g. only at time $t_1$, $t_2$, $t_3$, etc). In contrast, the bottom portion of FIG. 5 shows the outputs after they have passed through delays 404a-404c. As shown, when the delayed outputs are summed, the summed output changes value three times more frequently. In this way, a higher bandwidth analog output can be created.

Figure 4B:
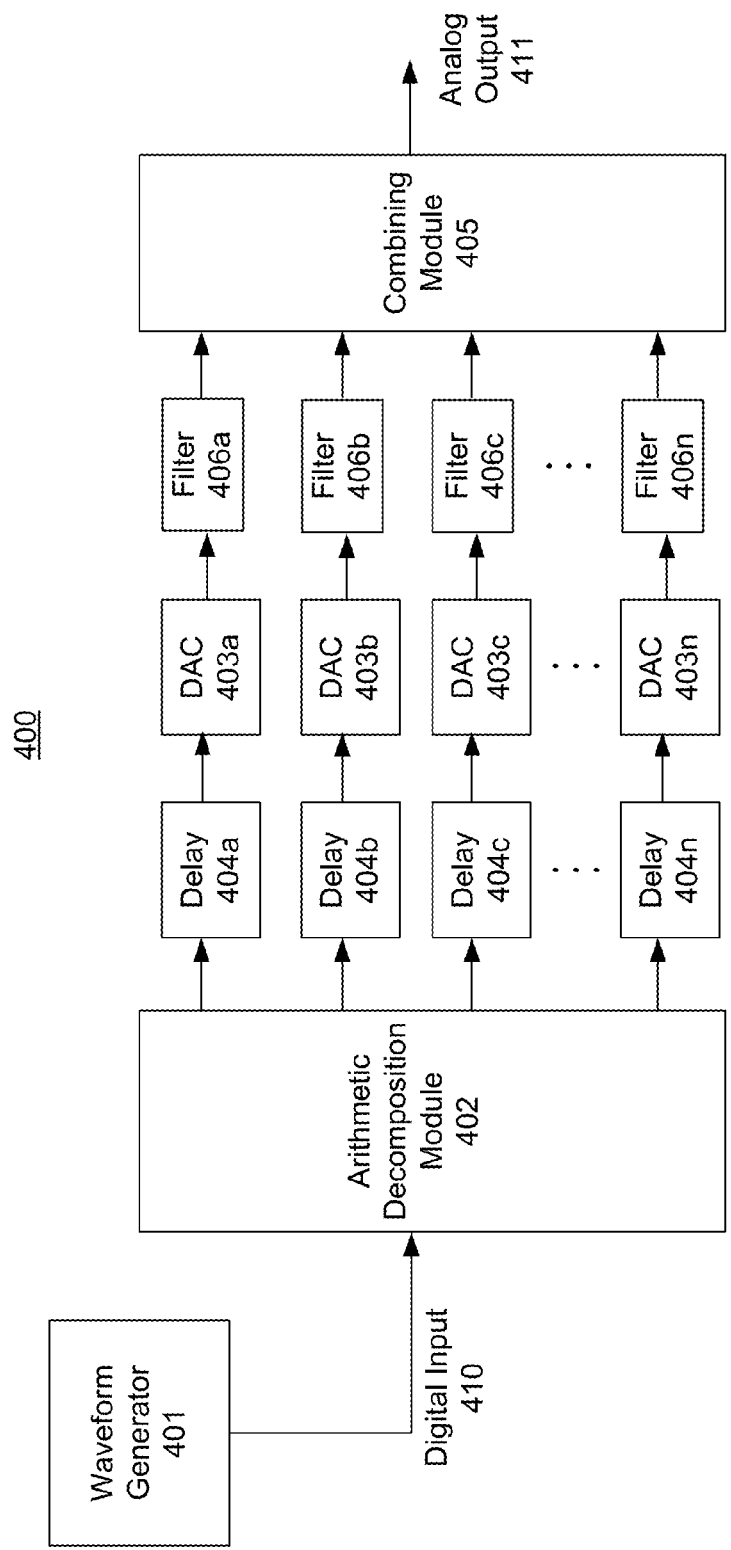

FIG. 5 illustrates an example where a delay is applied to the outputs of the DACs and assumes that the DACs are operating on the same clock. The same effect can also be achieved by applying the delay before the DACs (e.g. by incrementally delaying the clock signal to subsequent DACs and/or the inputs to the DACs so that the DACs provide outputs at different times). FIG. 4B illustrates an example where the delays are applied to the inputs before the DACs. In some embodiments, the decomposition module, as opposed to separate components, can include functionality for applying the necessary delays. Either approach for creating time-interleaved samples can be implemented in embodiments of the present invention. In some embodiments, it may be preferable to implement the delay before the DACs due to the efficiencies of time-shifting in the digital domain rather than the analog domain.

For this time-interleaving technique to generate the appropriate output signal, proper inputs to each DAC must be calculated. Various approaches have been proposed for calculating the appropriate inputs. However, these approaches have proven to be unstable or inefficient. For example, some of these approaches result in many poles on the unit circle which makes their use unstable when more than two DACs are employed.

According to embodiments of the present invention, a novel technique for calculating the appropriate inputs based on a desired output can be employed. This technique is stable when any number of DACs is used in parallel. The calculation of a next sample to be input to a particular DAC can be done using the following formula:

$$S_{p,t} = R_t - R_{t-1} + S_{p,t-1}$$

where $S_{p,t}$ is the next sample to be input to the DAC, $S_{p,t-1}$ is the previous sample that was input to the DAC, and $R_t$ is the current desired output. P represents the position of the DAC in the parallel arrangement of DACs. The current desired output can be viewed as a function of the position of the DAC in the parallel arrangement. For example, as described below and shown in FIGS. 6, 6A, and 6B, $R_t$ for a particular DAC can be determined as $R_{t+p}$.

Because the desired output is known (i.e. waveform generator 401 outputs the desired digital waveform), arithmetic decomposition module 402 implements the above equation to calculate the samples that are input to each DAC so that the DACs will output values that when summed yield the desired analog output.

FIG. 6 illustrates an example of how arithmetic decomposition module 402 can calculate samples for each DAC in a system that employs three DACs in parallel. The desired output is represented as a series of integer values, $R_t$, for simplicity. In FIG. 6, new samples (which are shaded gray) are provided to the DACs at every DAC clock cycle, X. The output of DAC1 is not delayed, while the outputs of DAC2 and DAC3 are delayed by ⅓ and ⅔ of a clock cycle respectively. Accordingly, the summed output of the three samples input at time $X_0$ (i.e. $R_0$) is not generated until ⅔ of a clock cycle after $X_0$ (which corresponds with the third row in the table).

To commence the generation of a desired analog output, the samples input to the DACs at time $X_0$ are chosen so that their sum equals the desired value of the output $R_0$. In the example in FIG. 6, $R_0$ equals 3 so a digital input of 1 is provided to each DAC at time $X_0$. Any other combination of values that sum to 3 could also be used (e.g. 3, 0, 0 or 8, −4, 1).

After the initial samples are selected for each DAC, the above formula can be used to calculate the value of the next sample for each DAC. For example, at time $X_1$ (i.e. t=1), values of 5, −5, and −3 are calculated for DAC1, DAC2, and DAC3 respectively. FIG. 6A illustrates how the value of 5 is calculated for DAC1. Because t=1 and p=0 for DAC1, the sample, $S_1$, to be supplied to DAC1 at time $X_0$ is equal to $R_1 - R_0 + S_0 = 7 - 3 + 1 = 5$.

FIG. 6B similarly shows how the value of −5 is calculated for the sample, $S_1$, to be provided to DAC2 at time $X_1$. In this case, p=1 yielding the equation $R_2 - R_1 + S_0 = 1 - 7 + 1 = -5$. Finally, the value of −3 would be calculated for DAC3 using p=2 such that the equation is $R_3 - R_2 + S_0 = 3 - 1 + 1 = -3$.

This process is repeated each cycle to ensure that appropriate samples are input to each DAC to generate the desired analog output. By implementing the above equation to calculate samples for each DAC, a system employing any reasonable number of DACs in parallel can be used. This equation can also be used in systems where the interleaving of samples is accomplished by varying the clock to each DAC or otherwise delaying the inputs to the DACs rather than by using delays on the outputs of the DACs.

Sub-Band Reconstruction

Another approach for increasing the sampling rate or resolution of a DAC is to employ multiple DACs in parallel which process different sub-bands of the overall signal. The outputs of each DAC are then recombined to form the desired output.

Figure 7:
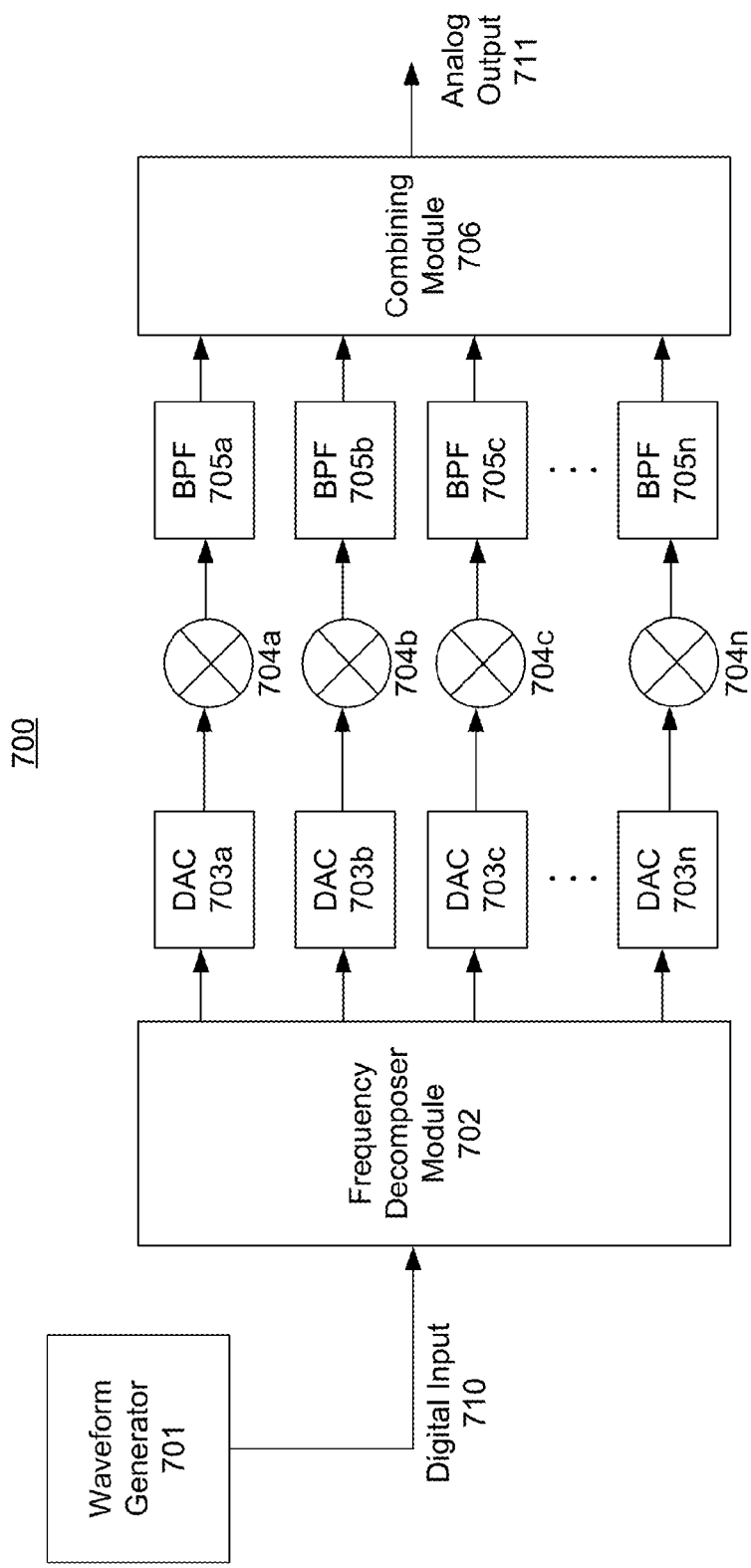
FIG. 7 illustrates an example circuit diagram that can be employed in a sub-band reconstruction system.

FIG. 7 illustrates an example circuit diagram that can be employed in a sub-band reconstruction system. FIG. 7 includes a frequency decomposer 702 which receives an input waveform 710 from a waveform generator 701 and divides the input waveform into M sub-bands. The sub-bands are output to M DACs 703a-703n which convert the digital value of the sub-band into an analog value. Each analog value is then passed through a mixer (704a-704n) and a bandpass filter (705a-705n) before being combined by combining module 706 to form wideband analog output 711.

Figure 8A:
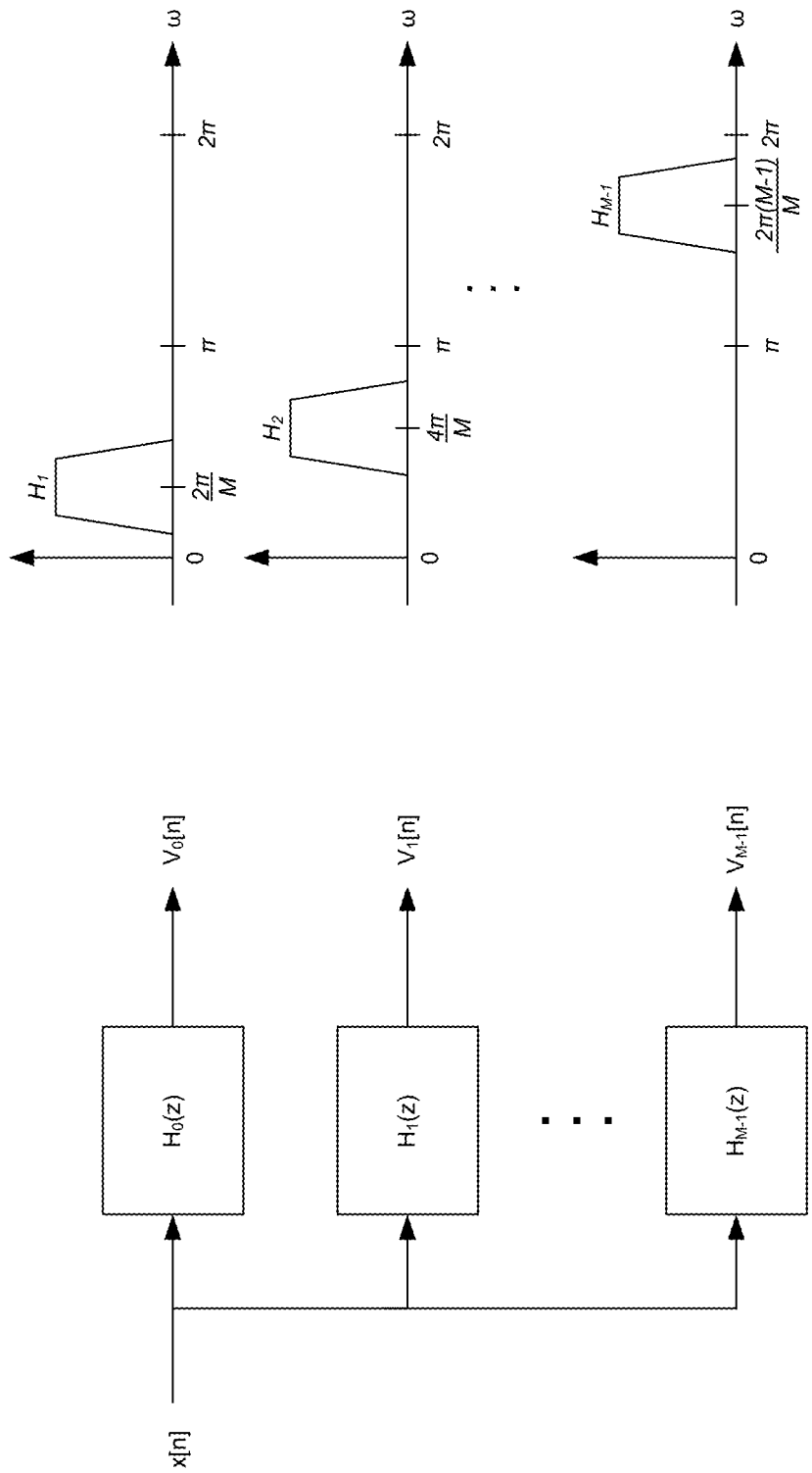
FIGS. 8A-8C represent different manners in which sub-bands can be generated from a digital signal.
Figure 8B:
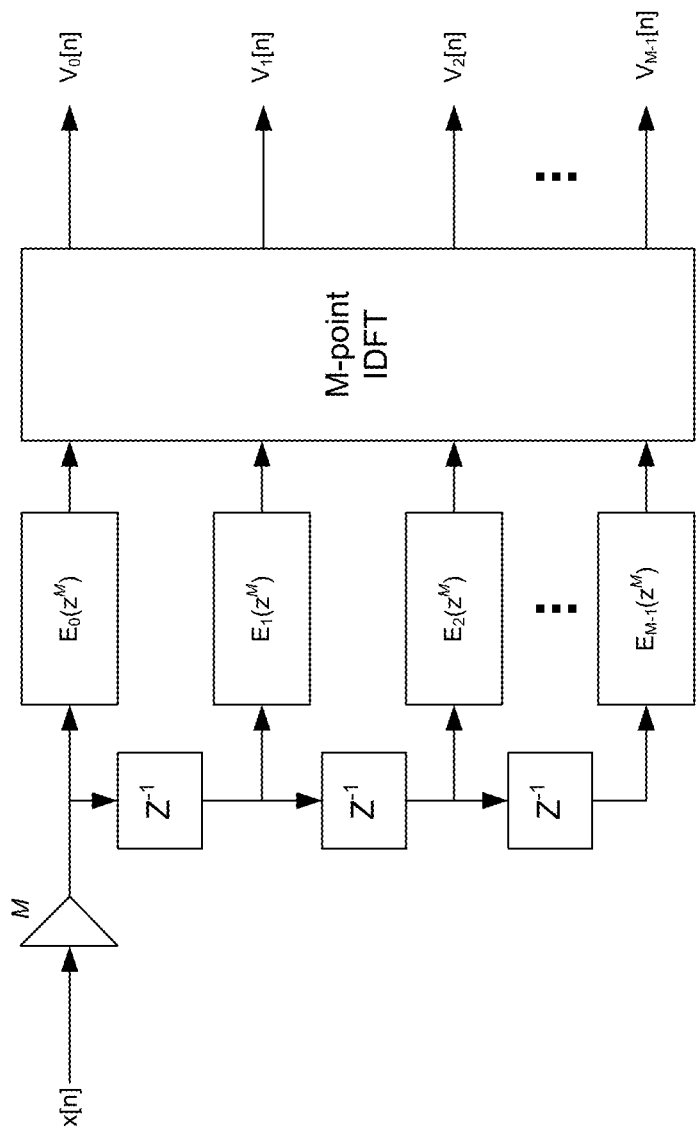
Figure 8C:
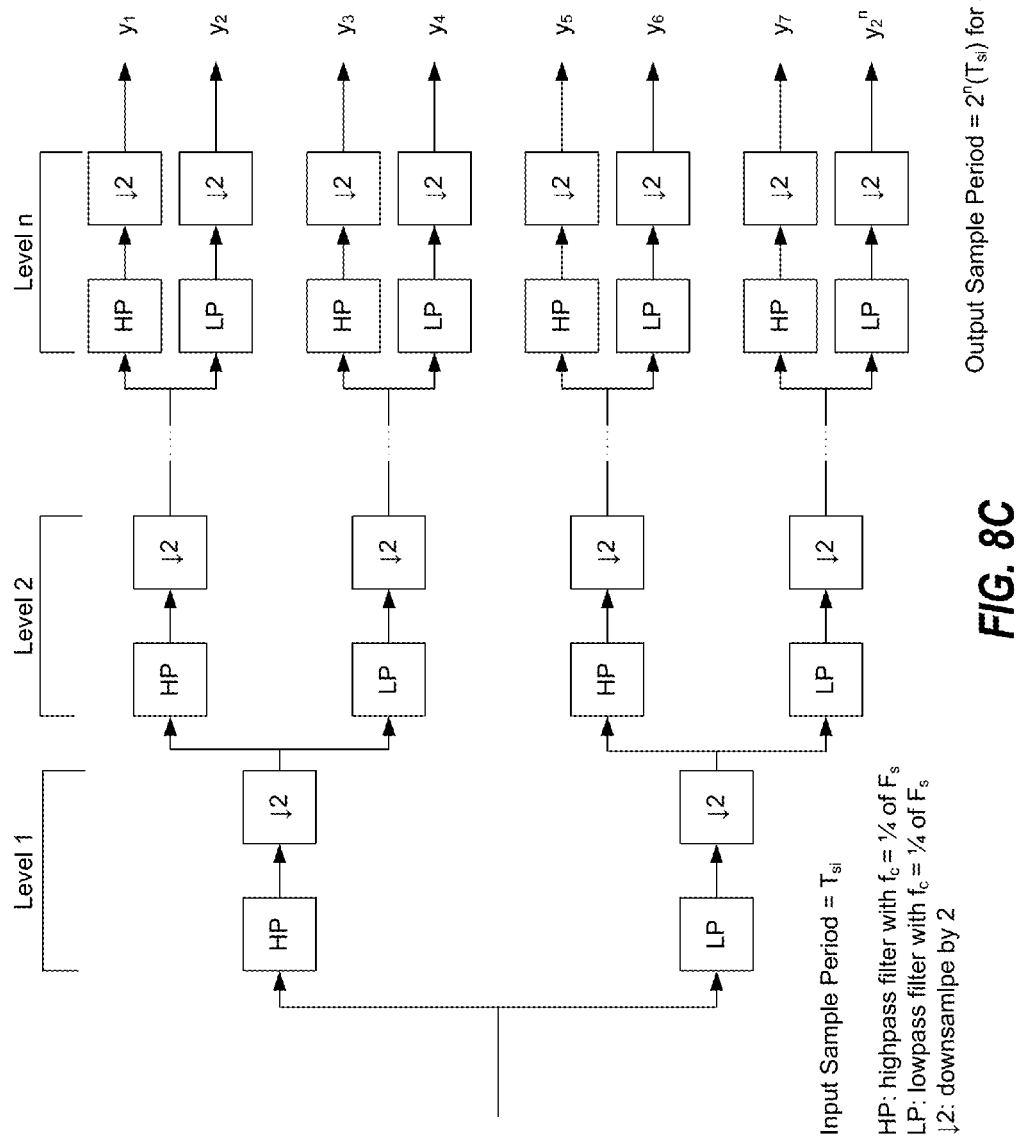
Figure 9:
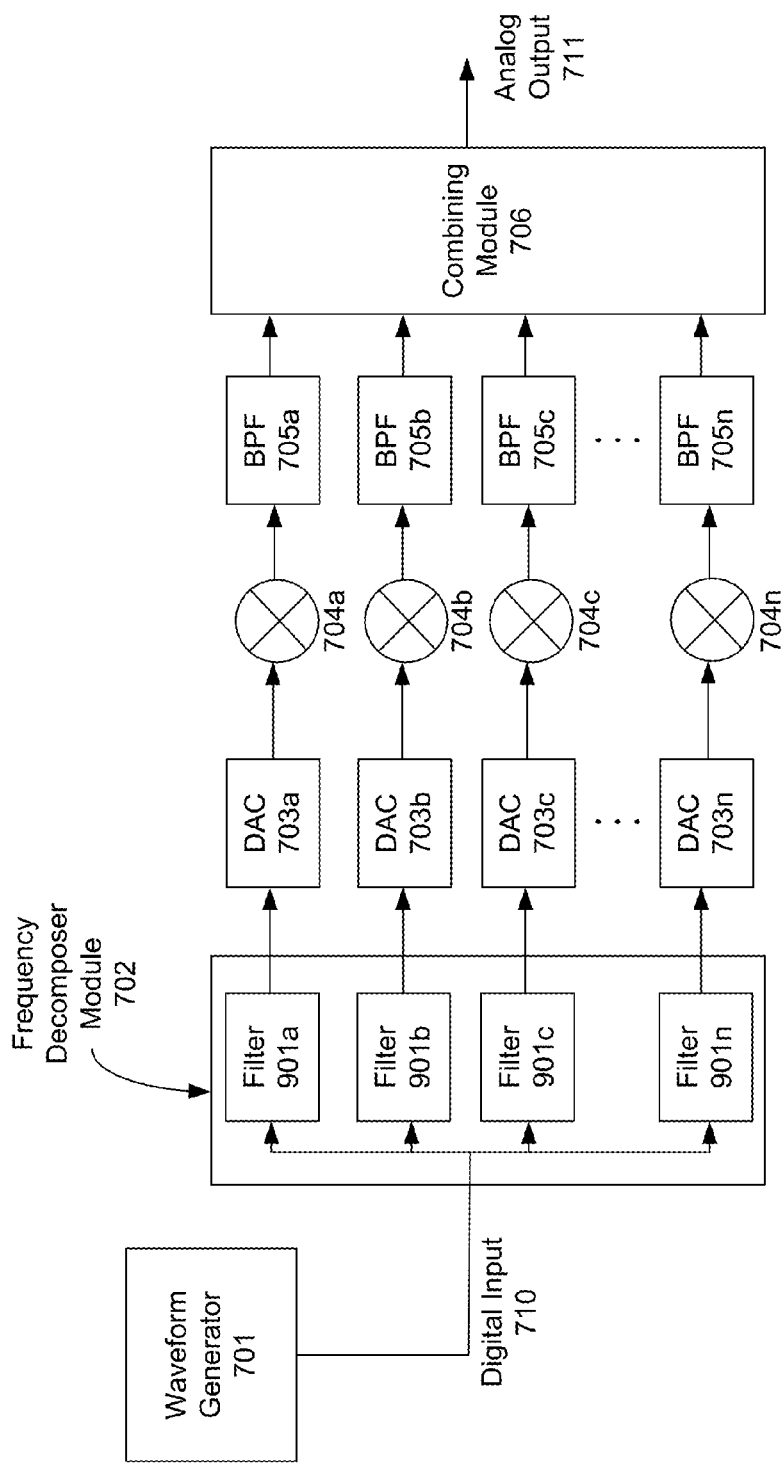
FIG. 9 illustrates a frequency decomposer that is configured as an N-band frequency analysis filter bank.

FIGS. 8A-8C each illustrate different example configurations of frequency decomposer 702 that can be used in the present invention. FIG. 8A illustrates an analysis filterbank (diagram on the left) where the diagram on the right represents the frequency bands covered by each filter. Generally, the digital samples are re-sampled at a lower rate so the bands shift down to near baseband and can therefore be represented at a slower sample rate. FIG. 9 depicts this type of analysis filter bank. Each filter 901a-901n is a decimation filter which reduces the sample rate to the DAC rate. This is possible because each sub-band is narrower in bandwidth than the original signal. Therefore each sub-band can be accurately represented at a lower sample rate.

FIG. 8B illustrates an M-band filter bank that is commonly referred to as the uniform DFT analysis filter bank. FIG. 8C illustrates an n-level tree-structured (symmetric) analysis filter bank. The decimation by a factor of 2 is shown after each filter. Since the signal is split into highpass (in frequency) and lowpass (in frequency) parts, each component can be represented by half the sample rate so decimation by 2 does not cause any loss of information. This is repeated at every level. This creates an exact replica of the original signal u using $2^n$ independent (sub-band) signals $y_1$ through $y_{2^n}$.

Additionally, in some embodiments, sub-bands can be created independently and then combined after the DACs. In such cases, waveform generator 701 may directly generate the sub-bands that are passed to DACs 703a-703n (i.e. no separate frequency decomposer module 702 would be required). For example, a signal consisting of the sum of 3 sine waves at frequencies 1 GHz, 1.5 GHz and 2.1 GHz would require a sample rate representation of greater than 4.2 Gsps (gigasamples per second) and a DAC of equivalent speed. These can instead be generated independently at lower frequency (e.g. 0.5 GHz each). The three sine waves can be sent to three independent DACs running at greater than 1.0 Gsps each. The output of each DAC is frequency shifted then combined (summed) to create the single waveform.

Regardless of the specific manner in which sub-bands are generated, the frequency response of each sub-band channel is the product of the corresponding digital analysis filter (901a-901n) with the frequency response of the DAC (703a-703n), mixer (704a-704n), and bandpass filter (705a-705n). Ideally, the frequency responses of adjacent channels add to a constant value at every frequency between the channel centers. However, in implementation, there are differences in the frequency responses of the different sub-band channels. These distortions can be minimized using the pre-distortion techniques described below.

Adaptive Pre-distortion of Digital Signal to Account for Degradation

In an ideal implementation, the output of the combining module will be an exact analog replica of the digital input signal provided by the waveform generator. However, in each of the above-described techniques, the output signal is susceptible to degradations which may be due to timing skew between the clocks to the individual converters, as well as to offset, gain, and frequency response mismatches among other factors. Accordingly, in some embodiments of the invention, a pre-distortion feedback loop can be employed to adaptively compensate for such degradations.

Figure 10:
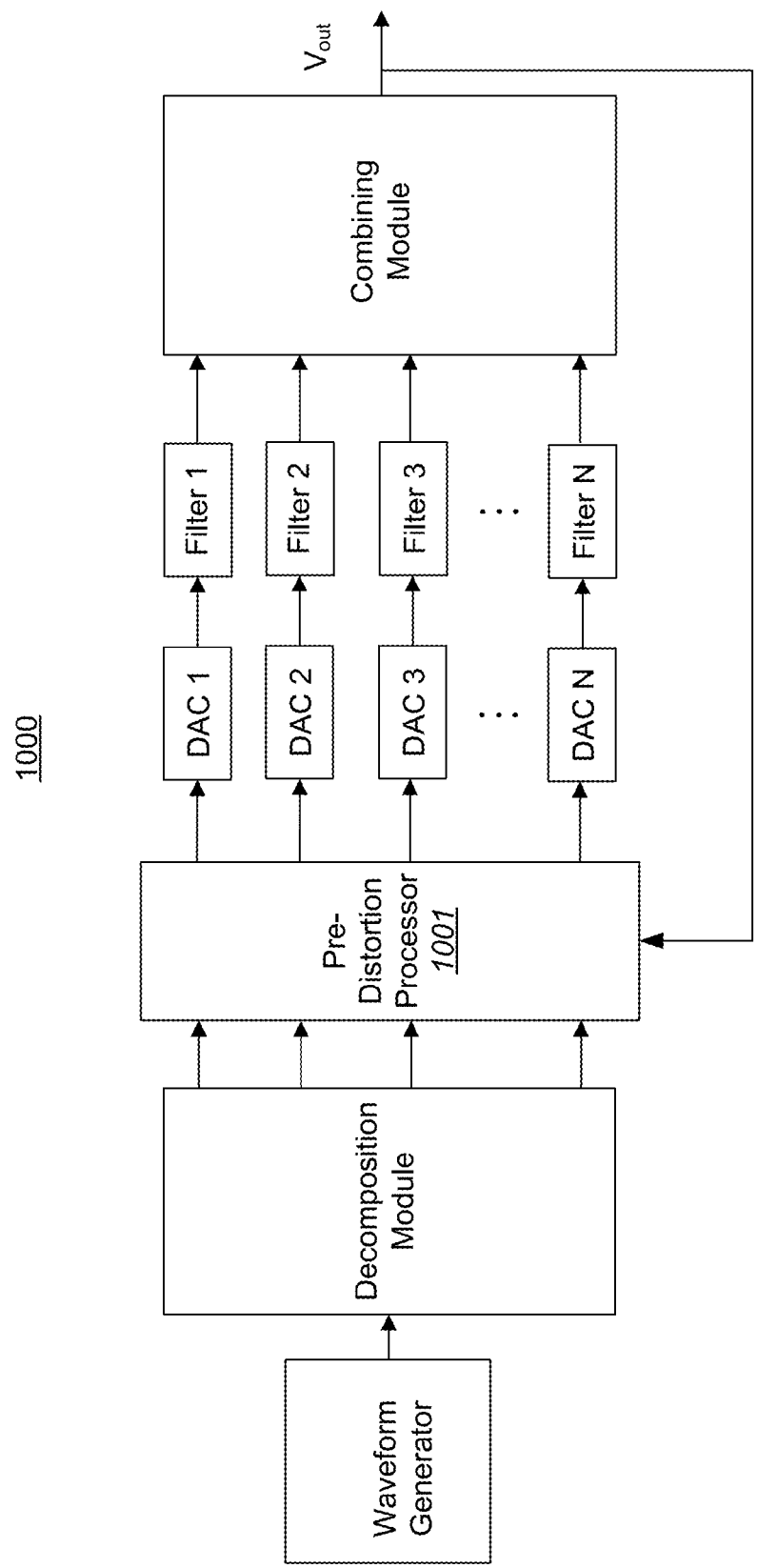
FIG. 10 illustrates a system similar to the system shown in FIG. 3 but with the addition of a pre-distortion processor.

FIG. 10 illustrates a system 1000 similar to system 300 shown in FIG. 3 but with the addition of pre-distortion processor 1001. Pre-distortion processor 1001 can be configured to apply distortion to the digital samples prior to the samples passing through the DAC and other components of each path to offset the distortion that will occur as the samples are converted into analog values and recombined into the analog output signal, Vout. Pre-distortion processor 1001 can be configured to detect distortion present in Vout and adjust the pre-distortion applied accordingly. In other embodiments, an open loop feedback system can be employed to compensate for distortion.

Figure 11:
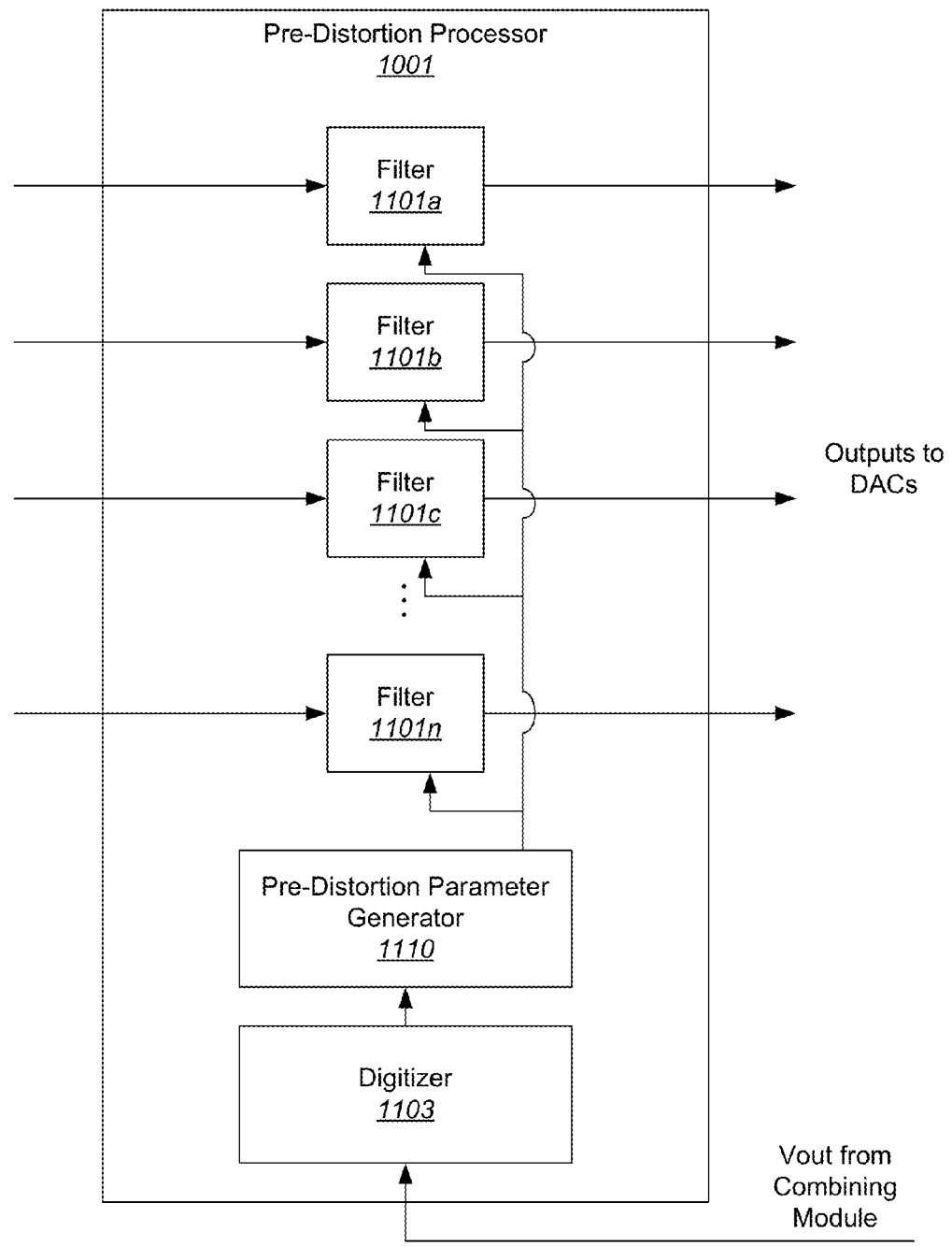
FIG. 11 illustrates an example of how a pre-distortion processor can apply pre-distortion to compensate for degradation when the time-interleaving or sub-band reconstruction techniques are implemented.

FIG. 11 illustrates an example of how pre-distortion processor 1001 can apply pre-distortion to compensate for degradation when the time-interleaving or sub-band reconstruction techniques are implemented. Pre-distortion processor comprises one or more filters for each path (1101a-1101n) in the system and a pre-distortion parameter generator 1110 that generates parameters for controlling the filters. A digitizer 1103 is also used to convert the analog output, Vout, into a digital value. In some embodiments, digitizer 1103 can be an analog-to-digital converter, while in other embodiments, digitizer 1103 can be an oscilloscope. This digital value of Vout is then provided to pre-distortion parameter generator 1110. Pre-distortion parameter generator 1110 can compare (e.g. via an adder) the digital value of Vout to the known digital value (i.e. the output of the waveform generator) from which Vout was generated. Although not shown, appropriate circuitry can be included to store the known digital value until it is needed for comparison to Vout.

Based on the comparison, pre-distortion parameter generator 1110 can identify whether any distortion is present in any of the paths of the system. When distortion is detected for a path, pre-distortion parameter generator 1110 can generate necessary parameters for controlling the corresponding filter in the path so that an appropriate pre-distortion is applied to samples on the path to compensate for the distortion that will later occur as the samples are processed. The parameter generator therefore works to minimize a function of the error between the digital value of Vout and the known digital value (i.e. the output of the waveform generator).

FIG. 11 illustrates that a single filter is used in each path; however, any number of filters could be used. Each filter can be tuned to provide a certain type of pre-distortion to the input sample. Both linear and nonlinear filters can be used to provide the appropriate pre-distortion to compensate for detected degradation in Vout. For example, the filters can be used to compensate for degradations due to timing delay misalignment or jitter (e.g. due to differences in traces or sampling clock offsets), degradations due to differences in frequency responses for different DACs or other components in the system, degradations due to DC offsets, etc. Also, FIG. 11 illustrates an independently implemented pre-distortion processor; however, the functionality provided by the pre-distortion processor can also be incorporated into or otherwise provided by other digital signal processing components used in the system such as a matched filter.

Accordingly, as Vout is generated, pre-distortion processor 1001 can monitor the error present in Vout to allow the error to be dynamically and adaptively compensated for. As such, pre-distortion processor 1001 can continuously monitor the degradation of Vout to dynamically generate appropriate parameters for the filters. The appropriate parameters will pre-distort the input signal to account for the degradation that will subsequently occur as the input signal is processed through the multi-DAC system.

Figure 12:
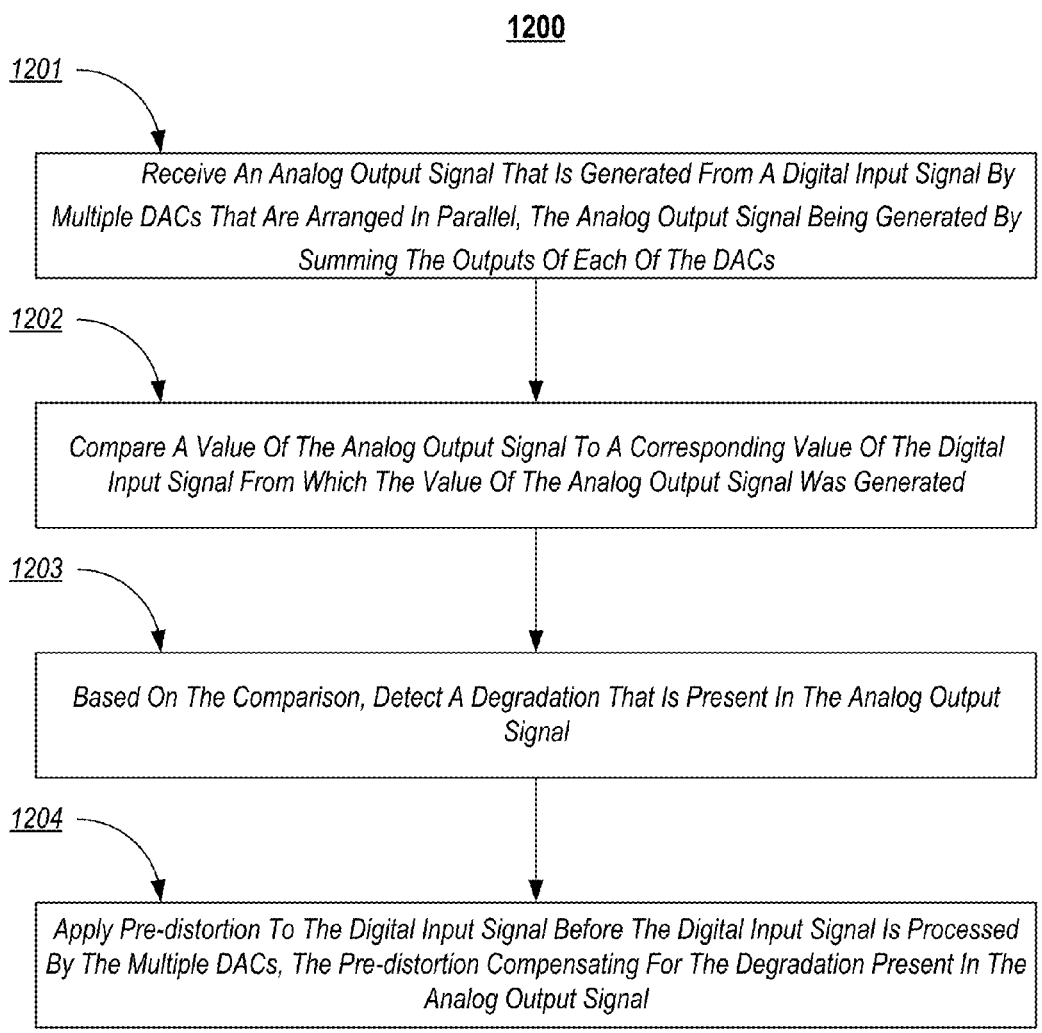
FIG. 12 illustrates a flowchart of an example method for applying pre-distortion to a digital input signal to compensate for degradation caused when multiple DACs are used in parallel to generate an analog output signal.

FIG. 12 illustrates a flowchart of an example method 1200 for applying pre-distortion to a digital input signal to compensate for degradation caused when multiple DACs are used in parallel to generate an analog output signal. Method 1200 will be described with reference to FIGS. 10 and 11.

Method 1200 includes an act 1201 of receiving an analog output signal that is generated from a digital input signal by multiple DACs that are arranged in parallel, the analog output signal being generated by summing the outputs of each of the DACs. For example, an analog output signal, Vout, can be generated using the time-interleaved or sub-band reconstruction techniques.

Method 1200 includes an act 1202 of comparing a value of the analog output signal to a corresponding value of the digital input signal from which the value of the analog output signal was generated. For example, an adder can be used to compare a digitized value of Vout to the digital value from which Vout was generated.

Method 1200 includes an act 1203 of, based on the comparison, detecting a degradation that is present in the analog output signal. For example, by analyzing the output of the adder, pre-distortion processor 1001 can identify degradation that is present in Vout.

Method 1200 includes an act 1204 of applying pre-distortion to the digital input signal before the digital input signal is processed by the multiple DACs, the pre-distortion compensating for the degradation present in the analog output signal. For example, pre-distortion processor 1001 can apply pre-distortion to the digital input signal to compensate for the detected degradation.

Although specific embodiments and applications of the invention have been described in this specification, these embodiments and applications are exemplary only, and many variations are possible.

We claim:

1. A system for producing an analog wideband signal using a parallel arrangement of digital-to-analog converters (DACs) that each convert a different frequency sub-band of a digital signal to produce the analog wideband signal, the system comprising:
    a frequency decomposer that receives a digital signal and divides the digital signal into M different frequency sub-bands;
    a parallel arrangement of M DACs, each of the M DACs for receiving one of the M different frequency sub-bands of the digital signal, and for generating an analog value representing the corresponding sub-band of the digital signal;
    for each of at least some of the M DACs, a frequency shifter for shifting the frequency of the analog value representing the corresponding frequency sub-band of the digital signal; and
    an adder for summing each of the analog values generated by the M DACs into an analog output signal,
    wherein the frequency decomposer comprises a first level comprising:
        a first level high pass filter comprising an input for receiving the digital signal, and
        a first level low pass filter comprising an input for receiving the digital signal, wherein the first level high pass filter is disposed in parallel with the first level low pass filter.

2. The system of claim 1, wherein the frequency shifters for one or more of the at least some of the M DACs shift the frequency of the corresponding frequency sub-band so that each frequency sub-band occupies a different frequency range.

3. The system of claim 1, further comprising:
    a pre-distortion processor for applying pre-distortion to the digital signal to compensate for degradations that will occur to the digital signal as the digital signal is converted into the analog output signal.

4. The system of claim 3, wherein the pre-distortion processor comprises:
    a digitizer for receiving the analog output signal and converting the analog output signal into a digitized output signal; and
    a second adder for comparing the digitized output signal to the digital signal from which the analog output signal was generated.

5. The system of claim 4, wherein the digitizer comprises:
    an analog-to-digital converter; or
    a digital oscilloscope.

6. The system of claim 4, wherein the pre-distortion processor further comprises:
    a pre-distortion parameter generator that receives an error signal from the second adder, the error signal representing the difference between the digitized output signal and the digital signal from which the analog output signal was generated, and causes pre-distortion to be applied to the digital signal to compensate for the difference.

7. The system of claim 6, wherein the pre-distortion processor comprises one or more filters for applying the pre-distortion to the digital signal.

8. The system of claim 7, wherein the pre-distortion parameter generator generates one or more parameters for configuring the one or more filters to apply the pre-distortion.

9. A system for producing a wideband signal using a parallel arrangement of digital-to-analog converters (DACs), the system comprising:
    a source of a digital signal to be converted into an analog wideband signal;
    an arithmetic decomposition module that receives the digital signal and calculates samples of the digital signal;
    a parallel arrangement of DACs that each convert samples received from the arithmetic decomposition module into analog values;
    means for providing a delay to the analog values output by at least some of the DACs; and
    a combining module for combining the analog values generated by the DACs into an analog output signal;
    wherein the arithmetic decomposition module calculates samples for a particular DAC using the following formula:

$$S_{p,t} = R_t - R_{t-1} + S_{p,t-1}$$

where $S_{p,t}$ is the next sample to be input to the particular DAC, $S_{p,t-1}$ is the previous sample that was input to the particular DAC, $R_t$ is the current desired value of the analog output signal, and p represents the position of the parallel DAC in the parallel arrangement of DACs.

10. The system of claim 9, wherein the means for providing a delay comprises a delay component for each of the at least some DACs that is positioned between the source of the digital signal and the combining module.

11. The system of claim 9, wherein the means for providing a delay comprises circuitry for delaying a clock signal to the at least some DACs such that the at least some DACs output analog values at different times.

12. The system of claim 9, further comprising:
    a pre-distortion processor for applying pre-distortion to the digital signal to compensate for degradations that will occur to the digital signal as the digital signal is converted into the analog output signal.

13. The system of claim 12, wherein the pre-distortion processor comprises:
    a digitizer for receiving the analog output signal and converting the analog output signal into a digitized output signal; and an adder for comparing the digitized output signal to the digital signal from which the analog output signal was generated.

14. The system of claim 13, wherein the pre-distortion processor further comprises:
   a pre-distortion parameter generator that receives an error signal from the adder, the error signal representing the difference between the digitized output signal and the digital signal from which the analog output signal was generated; and
   one or more structures which are controlled by the pre-distortion parameter generator to cause pre-distortion to be applied to the digital signal to compensate for the difference.

15. The system of claim 14, wherein the pre-distortion parameter generator generates one or more parameters for configuring the one or more structures to apply the pre-distortion.

16. A method for applying pre-distortion to a digital input signal to compensate for degradation caused when multiple DACs are used in parallel to generate an analog output signal, the method comprising:
   dividing a digital input signal having a first sample rate into M different frequency sub-bands;
   providing the divided digital input signal in each of the M different frequency sub-bands to a different one of M parallel DACs;
   each of the DACs converting at a second sample rate a digital value of the divided digital input signal in a corresponding one of the M different frequency sub-bands into an analog value, the second sample rate being less than the first sample rate;
   combining the analog values generated by the M parallel DACs to form an analog output signal;
   comparing a value of the analog output signal to a corresponding value of the digital input signal;
   based on the comparison, detecting a degradation that is present in the analog output signal; and
   applying pre-distortion to the digital input signal before the digital input signal is provided to the M parallel DACs, the pre-distortion compensating for the degradation present in the analog output signal,
   wherein the dividing comprises filtering the digital input signal in a tree structure comprising successive hierarchical levels of parallel high pass filters and low pass filters, each one of the levels comprising a greater number of high pass filters and low pass filters than a previous one of the levels.

17. The system of claim 1, wherein a sample rate at which each of the DACs is configured to operate is less than a sample rate corresponding to the bandwidth of the digital input signal.

18. The system of claim 17, wherein the sample rate at which each of the DACs is configured to operate is approximately 1/M of the sample rate corresponding to the digital input signal.

19. The system of claim 17, wherein a sample rate of the divided digital signal in each of the M frequency sub-bands is less than or equal to the sample rate at which each of the DACs is configured to operate.

20. The system of claim 1, wherein the frequency decomposer comprises decimation filters comprising outputs connected to inputs of the M DACs.

21. A system for producing an analog wideband signal using a parallel arrangement of digital-to-analog converters (DACs) that each convert a different frequency sub-band of a digital signal to produce the analog wideband signal, the system comprising:
   a frequency decomposer that receives a digital signal and divides the digital signal into M different frequency sub-bands;
   a parallel arrangement of M DACs, each of the M DACs for receiving one of the M different frequency sub-bands of the digital signal, and for generating an analog value representing the corresponding sub-band of the digital signal;
   for each of at least some of the M DACs, a frequency shifter for shifting the frequency of the analog value representing the corresponding frequency sub-band of the digital signal; and an adder for summing each of the analog values generated by the M DACs into an analog output signal, wherein:
   the frequency decomposer comprises a tree structure comprising successive hierarchical levels, and
   each one of the levels comprises a greater number of high pass filters and low pass filters than a previous one of the levels.

22. The system of claim 1, wherein the first level further comprises:
   a first decimator comprising an input connected to an output of the first level high pass filter, and
   a second decimator comprising an input connected to an output of the first level low pass filter.

23. The system of claim 1, wherein the frequency decomposer further comprises a second level comprising:
   a second level first high pass filter comprising an input for receiving an output of the first level high pass filter,
   a second level first low pass filter comprising an input for receiving an output of the first level high pass filter,
   a second level second high pass filter comprising an input for receiving an output of the first level low pass filter,
   a second level second low pass filter comprising an input for receiving an output of the first level low pass filter,
   wherein the second level first high pass filter is disposed in parallel with the second level first low pass filter, and
   the second level second high pass filter is disposed in parallel with the second level second low pass filter.

24. The system of claim 23, wherein the first level further comprises:
   a first decimator disposed between the output of the first level high pass filter and the inputs of the second level first high pass filter and the second level first low pass filter, and
   a second decimator disposed between the output of the first level low pass filter and the inputs of the second level second high pass filter and the second level second low pass filter.

25. The system of claim 24, wherein:
   the second level further comprises a plurality of additional decimators, and
   each of the additional decimators is connected to one of the second level first high pass filter, the second level first low pass filter, the second level second high pass filter, or the second level second low pass filter.

26. The system of claim 1 further comprising a waveform generator for generating the digital signal to be converted into the analog wideband signal.

27. The system of claim 9, wherein the signal source is a waveform generator.

28. The system of claim 16, wherein the second sample rate is approximately 1/M of the first sampling rate.

29. The system of claim 16, wherein the divided digital input signal has the second sample rate in each of the M different frequency sub-bands.

30. The method of claim 16, wherein the dividing further comprises decimating the digital input signal in each of the M different frequency sub-bands.

31. The method of claim 16, wherein the applying distortion comprises:
   generating parameters corresponding to the pre-distortion from a difference between a digitized version of the analog output signal and the digital input signal from which the analog output signal was generated; and
   filtering the divided digital input signal in each of the M different frequency sub-bands in accordance with the generated parameters.

32. A method for converting a digital signal into an analog signal, the method comprising:
   arithmetically decomposing the digital signal into samples to be provided to parallel DACs, wherein the arithmetically decomposing comprises calculating samples for a particular one of the DACs using the following formula:

$$S_{p,t} = R_t - R_{t-1} + S_{p,t-1}$$

where $S_{p,t}$ is the next sample to be input to the particular DAC, $S_{p,t-1}$ is the previous sample that was input to the particular DAC, $R_t$ is the current desired value of the analog output signal, and p represents the position of the particular DAC among the parallel DACs;
   providing the samples to the parallel DACs, which convert the samples into analog values;
   delaying the analog values generated by at least one of the DACs;
   combining the analog values into an analog output signal;
   comparing a value of the analog output signal to a corresponding value of the digital input signal;
   based on the comparison, detecting a degradation that is present in the analog output signal; and
   applying pre-distortion to the digital input signal before the digital input signal is provided to the M parallel DACs, the pre-distortion compensating for the degradation present in the analog output signal.

33. The method of claim 32, wherein the applying distortion comprises:
   generating parameters corresponding to the pre-distortion from a difference between a digitized version of the analog output signal and the digital input signal from which the analog output signal was generated; and
   filtering the samples to be provided to the parallel DACs.

* * * * *